(12) United States Patent
Wang (10) Patent No.: US 10,205,093 B2
(45) Date of Patent: Feb. 12, 2019

(54) VERTICAL HALL EFFECT ELEMENT WITH IMPROVED SENSITIVITY

(71) Applicant: Allegro MicroSystems, LLC, Manchester, NH (US)

(72) Inventor: Yigong Wang, Rutland, MA (US)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

(21) Appl. No.: 15/370,107

(22) Filed: Dec. 6, 2016

(65) Prior Publication Data

US 2017/0084831 A1  Mar. 23, 2017

Related U.S. Application Data

(62) Division of application No. 13/752,681, filed on Jan. 29, 2013, now Pat. No. 9,548,443.

(51) Int. Cl.
| | |
|---|---|
| *H01L 29/82* | (2006.01) |
| *H01L 43/14* | (2006.01) |
| *H01L 43/06* | (2006.01) |
| *G01R 33/00* | (2006.01) |
| *G01R 33/07* | (2006.01) |

(52) U.S. Cl.
CPC .......... *H01L 43/14* (2013.01); *G01R 33/0052* (2013.01); *G01R 33/077* (2013.01); *H01L 43/065* (2013.01)

(58) Field of Classification Search
CPC ..... H01L 43/065; H01L 43/14; G01R 33/077; G01R 33/0052
See application file for complete search history.

(56) References Cited

U.S. PATENT DOCUMENTS

| | | | |
|---|---|---|---|
| 4,634,961 A | 1/1987 | Popovic | |
| 4,668,914 A | 5/1987 | Kersten et al. | |
| 4,761,569 A | 8/1988 | Higgs | |
| 4,829,352 A | 5/1989 | Popovic et al. | |
| 4,970,411 A | 11/1990 | Halg et al. | |
| 5,541,506 A | 7/1996 | Kawakita et al. | |
| 5,572,058 A * | 11/1996 | Biard | H01L 27/22 257/421 |
| 5,612,618 A | 3/1997 | Arakawa | |
| 5,619,137 A | 4/1997 | Vig et al. | |

(Continued)

FOREIGN PATENT DOCUMENTS

| | | |
|---|---|---|
| DE | 10 2005 014 509 B4 | 10/2006 |
| DE | 10 2006 017 910 A1 | 10/2007 |

(Continued)

OTHER PUBLICATIONS

S.Reymond, P.Kejik and R.S.Popovic; "True 2DCMOS integrated Hall Sensor" presented at IEEE Sensors 2007 Conference, Oct. 28-31, 2007; p. 860-863.*

(Continued)

*Primary Examiner* — Nishath Yasmeen
(74) *Attorney, Agent, or Firm* — Daly, Crowley, Mofford & Durkee, LLP (57) ABSTRACT

A vertical Hall Effect element includes a low voltage P-well region disposed at a position between pickups of a vertical Hall Effect element to result in an improved sensitivity of the vertical Hall Effect element. A method results in the vertical Hall Effect element having the improved sensitivity.

13 Claims, 5 Drawing Sheets

(56) References Cited

U.S. PATENT DOCUMENTS

| | | |
|---|---|---|
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |
| 6,064,199 A | 5/2000 | Walter et al. |
| 6,064,202 A | 5/2000 | Steiner et al. |
| 6,091,239 A | 7/2000 | Vig et al. |
| 6,100,680 A | 8/2000 | Vig et al. |
| 6,166,535 A | 12/2000 | Irle et al. |
| 6,232,768 B1 | 5/2001 | Moody et al. |
| 6,236,199 B1 | 5/2001 | Irle et al. |
| 6,265,864 B1 | 7/2001 | De Winter et al. |
| 6,288,533 B1 | 9/2001 | Haeberli et al. |
| 6,297,627 B1 | 10/2001 | Towne et al. |
| 6,356,741 B1 | 3/2002 | Bilotti et al. |
| 6,525,531 B2 | 2/2003 | Forrest et al. |
| 6,542,068 B1 | 4/2003 | Drapp et al. |
| 6,545,462 B2 | 4/2003 | Schott et al. |
| 6,622,012 B2 | 9/2003 | Bilotti et al. |
| 6,768,301 B1 | 7/2004 | Hohe et al. |
| 6,969,988 B2 | 11/2005 | Kakuta et al. |
| 7,030,606 B2 | 4/2006 | Kato et al. |
| 7,038,448 B2 | 5/2006 | Schott et al. |
| 7,085,119 B2 | 8/2006 | Bilotti et al. |
| 7,119,538 B2 | 10/2006 | Blossfeld |
| 7,159,556 B2 | 1/2007 | Yoshihara |
| 7,235,968 B2 | 6/2007 | Popovic et al. |
| 7,259,556 B2 | 8/2007 | Popovic et al. |
| 7,307,824 B2 | 12/2007 | Bilotti et al. |
| 7,362,094 B2 | 4/2008 | Voisine et al. |
| 7,714,570 B2 | 5/2010 | Thomas et al. |
| 7,746,065 B2 | 6/2010 | Pastre et al. |
| 7,759,929 B2 | 7/2010 | Forsyth |
| 7,872,322 B2 | 1/2011 | Schott et al. |
| 7,911,203 B2 | 3/2011 | Thomas et al. |
| 7,936,029 B2 | 5/2011 | Wang |
| 7,965,076 B2 | 6/2011 | Schott |
| 7,994,774 B2 | 8/2011 | Thomas et al. |
| 9,312,473 B2 | 4/2016 | Kosier et al. |
| 2004/0207031 A1 | 10/2004 | Berndt et al. |
| 2005/0230770 A1* | 10/2005 | Oohira ............... G01R 33/07 257/421 |
| 2006/0011999 A1 | 1/2006 | Schott et al. |
| 2006/0164080 A1 | 7/2006 | Popovic et al. |
| 2007/0029998 A1 | 2/2007 | Popovic et al. |
| 2007/0290682 A1 | 12/2007 | Oohira et al. |
| 2009/0051351 A1 | 2/2009 | Forsyth |
| 2009/0121707 A1 | 5/2009 | Schott |
| 2009/0174395 A1 | 7/2009 | Thomas et al. |
| 2009/0295375 A1* | 12/2009 | Oohira ............... G01D 5/145 324/207.21 |
| 2010/0134101 A1 | 6/2010 | Riva et al. |
| 2010/0156397 A1 | 6/2010 | Yabusaki et al. |
| 2010/0164491 A1 | 7/2010 | Kejik et al. |
| 2010/0207222 A1 | 8/2010 | Wang |
| 2010/0219810 A1 | 9/2010 | Rocznik et al. |
| 2010/0252900 A1* | 10/2010 | Minixhofer ........... G01R 33/07 257/421 |
| 2011/0204460 A1* | 8/2011 | Wong ................ H01L 43/065 257/427 |
| 2011/0248708 A1 | 10/2011 | Thomas et al. |
| 2012/0001279 A1 | 1/2012 | Hioka et al. |
| 2012/0313635 A1 | 12/2012 | Daubert |
| 2013/0021026 A1 | 1/2013 | Ausserlechner |
| 2013/0021027 A1 | 1/2013 | Ausserlechner |
| 2014/0210023 A1 | 7/2014 | Wang |
| 2016/0190433 A1 | 6/2016 | Kosier et al. |

FOREIGN PATENT DOCUMENTS

| | | |
|---|---|---|
| DE | 10 2006 037 226 A1 | 2/2008 |
| EP | 0 631 416 B1 | 12/1994 |
| EP | 0 671 773 A2 | 9/1995 |
| EP | 0 875 733 B1 | 11/1998 |
| EP | 0 916 074 B1 | 5/1999 |
| EP | 2 000 814 A2 | 12/2008 |
| EP | 2 234 185 A1 | 9/2010 |
| EP | 2 503 612 A2 | 9/2012 |
| JP | 58-055688 A | 4/1983 |
| JP | 2003-042709 | 2/2003 |
| JP | 2005-241269 | 9/2005 |
| JP | 2007 027515 A | 2/2007 |
| JP | 2010-014607 | 1/2010 |
| JP | 2010-078366 | 4/2010 |
| WO | WO 1998/010302 | 3/1998 |
| WO | WO 1998/054547 | 12/1998 |
| WO | WO 2000/002266 | 1/2000 |
| WO | WO 2003/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008 145662 A1 | 12/2008 |
| WO | WO 2009/124969 A1 | 10/2009 |

OTHER PUBLICATIONS

Communication pursuant to Article 94(3) EPC for EP Pat. Appl. No. 14702402.0-1556; 4 pages.

Kaufmann et al.; "Novel Coupling Concept for Five-Contact Vertical Hall Devices;" 2011 IEEE Conference on Transducers, Beijing, China; Jun. 5-9, 2011; 4 Pages.

Allegro Microsystems, Inc.; "High Precision Linear Hall Effect Sensor IC with a Push/Pull, Pulse Width Modulated Output;" A1351; pp. 1-23.

Allegro Microsystems, Inc.; "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.

Kejik, et al.; "Ultra Low-Power Angular Position Sensor for High-Speed Portable Applications;" 2009 IEEE Sensors Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

Memsic Corporation; AN-00MM-004; "Electronic Tilt Compensation;" Mar. 2008; 5 pages.

Memsic Corporation; AN-00MM-003; "Magnetic Sensor Calibration;" Mar. 2008; 5 pages.

Memsic Corporation; AN-00MM-002; "Magnetometer Soldering Methodology;" Jun. 2008; 2 pages.

Memsic Corporation; AN-00MM-001; "Magnetometer Fundamentals;" Jun. 2008; 6 pages.

Memsic Corporation; AN-00MM-005; "Magnetic Sensor Placement Guidelines;" Oct. 2008; 2 pages.

Memsic Corporation; MMC312xMQ; "Tri-axis Magnetic Sensor, with I²C Interface;" Aug. 14, 2008; 9 pages.

Memsic Corporation; MMC314xMS; "Ultra Small 3-axis Magnetic Sensor, with I²C Interface;" Mar. 31, 2010; 8 pages.

Micronas GmbH; "Hal® 3625 Programmable Direct Angle Sensor;" Product Information; Sep. 2009; 2 pages.

(56) References Cited

OTHER PUBLICATIONS

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.
Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output;" published Mar. 7, 2008; pp. 1-23.
Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.
Allegro Microsystems, Inc.; "A3212 Data Sheet: Micropower, Ultra-Sensitive Hall-Effect Switch;" published Sep. 22, 2004; pp. 1-12.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.
Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.
Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10.
Atherton et al.; "Sensor Signal Conditioning—an IC Designer's Perspective;" IEEE Electro International; Apr. 26-28, 1991; pp. 129-134.
Austria Microsystems; "AS5040 datasheet; 10-Bit Programmable Magnetic Rotary Encoder;" Revision 1.1; Jan. 2004; pp. 1-20.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.
Blanchard et al.; "Cylindrical Hall Device;" International Electron Devices Meeting; Dec. 8-11, 1996; pp. 541-544.
Burger et al.; "New fully integrated 3-D silicon Hall sensor for precise angular-position measurements;" Sensors and Actuators, A 67; May 1998; pp. 72-76.
Dwyer; Allegro Microsystems, Inc.; "AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Jorunal of Applied Physics, vol. 85, No. 8; Apr. 15, 1999; pp. 5459-5461.
Gilbert; "Technical Advances in Hall-Effect Sensing;" Allegro Microsystems, Inc. Product Description; May 10, 2008; 7 sheets.
Häberli et al.; "Contactless Angle Measurements by CMOS Magnetic Sensor with On Chip Read-Out Circuit;" The 8th International Conference on Solid-State Sensors and Actuators and Eurosensors IX; Jan. 25-29, 1995; pp. 134-137.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.
Hiligsmann et al.; "Monolithic 360 Degrees Rotary Position Sensor IC;" 2004 IEEE Proceedings of Sensors, vol. 3; Oct. 24-27, 2004; pp. 1137-1142.
Kejik et al.; "Circular Hall Transducer for Angular Position Sensing;" International Solid-State Sensors, Actuators and Microsystems Conference; Transducers; Jun. 2007; pp. 2593-2596.
Lou Law; "Angle Position Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceedings II; May 2009; pp. 41-46.
Metz et al.; "Contactless Angle Measurement Using Four Hall Devices on Single Chip;"; International Conference on Solid State Sensors and Actuators; Transducers; vol. 1; Jun. 16-19, 1997; pp. 385-388.
Munter; "A Low-offset Spinning-current Hall Plate;" Sensors and Actuators, vol. A21-A23; Jan. 1990; pp. 743-746.
Novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The 8th International Conference on Solid-State Sensors and Acutators, Physical vol. 53, Issues 1-3; May 1996; pp. 278-283.
Petoussis et al.; "A Novel Hall Effect Sensor Using Elaborate Offset Cancellation Method;" Sensors & Transducers Journal, vol. 100, Issue 1; Jan. 2009; pp. 85-91.
Popovic; "Not-plate-like Hall magnetic sensors and their applications;" Sensors and Actuators A: Physical, vol. 85, Issues 1-3; Aug. 2000; pp. 9-17.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.
Roumenin; "Magnetic sensors continue to advance towards perfection;" Sensors and Actuators A: Physical, vol. 46-47, Issues 1-3; Jan.-Feb. 1995; pp. 273-279.
Schneider et al.; "Temperature Calibration of CMOS Magnetic Vector Probe for Contactless Angle Measurement System;" International Electron Devices Meeting; Dec. 8-11, 1996; pp. 533-536.
Sensima technology sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20trasduttori/Data%20Sheet%20-%202SA-10.pdf; pp. 1-7.
van der Meer; et al; "CMOS quad spinning-current Hall-sensor system for compass application;" IEEE Proceedings of Sensors, vol. 3; Oct. 24-27, 2004; pp. 1434-1437.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230.
Drljaca, et al.; "Nonlinear Effects in Magnetic Angular Position Sensor With Integrated Flux Concentrator;" Proc. 23rd International Conference on Microelectronics (MIEL 2002); vol. 1; NIS; Yugoslavia; May 12-15, 2002; pp. 223-226.
Petrie; "Circular Vertical Hall Magnetic Field Sensing Element and Method with a Plurality of Continuous Output Signals;" U.S. Appl. No. 13/035,243; filed Feb. 25, 2011; 56 pages.
Melexis MLX 90324; ""Under-the-Hood" Triaxis Rotary Position feat. SENT Protocol;" 3901090324 Data Sheet; Dec. 2008; 40 pages.
PCT Search Report and Written Opinion of the ISA dated Jan. 21, 2014; for PCT Pat. App. No. PCT/US2013/064237; 21 pages.
PCT Search Report and Written Opinion of the ISA dated Apr. 15, 2014; for PCT Pat. App. No. PCT/US2014/011773; 8 pages.
Banjevic; "High Bandwidth CMOS Magnetic Sensors Based on the Miniaturized Circular Vertical Hall Device;" Sep. 2011; 153 pages.
Office Action dated Sep. 2, 2014; for U.S. Appl. No. 13/836,869; 12 pages.
PCT Notification of Transmittal of ISR and Written Opinion dated Dec. 16, 2014 corresponding to Patent Appl. No. PCT/US2014/053826; 1 Page.

(56) References Cited

OTHER PUBLICATIONS

PCT International Search Report dated Dec. 16, 2014 corresponding to Patent Appl. No. PCT/US2014/053826; 5 Pages.
PCT Written Opinion dated Dec. 16, 2014 corresponding to Patent Appl. No. PCT/US2014/053826; 8 Pages.
Final Office Action dated Mar. 26, 2015 corresponding to U.S. Appl. No. 13/836,869; 31 Pages.
Taiwan Office Action and Search Report dated Apr. 21, 2015; for Taiwan Pat. App. No. 102137325; 10 pages.
Response to Final Office Action dated Mar. 26, 2015 corresponding to U.S. Appl. No. 13/836,869; Response filed on May 5, 2015; 7 Pages.
Response to Office Action dated Dec. 18, 2014 corresponding to U.S. Appl. No. 14/041,063; Response Filed on May 18, 2015; 17 Pages.
Notice of Allowance dated May 29, 2015 corresponding to U.S. Appl. No. 13/836,869; 8 Pages.
Email from Taiwan International Patent & Law Office dated Jul. 22, 2015; for Taiwan Pat. App. No. 102137325; 2 pages.
Taiwan Amendment (including specification and claims in English) dated Jul. 22, 2015; for Taiwan Pat. App. No. 102137325; 13 pages.
Taiwan Office Action (with English Translation) dated Aug. 5, 2015 corresponding to Taiwan Patent Application No. 103102458; 22 Pages.
PCT International Preliminary Report and Written Opinion of the ISA dated Aug. 13, 2015 corresponding to International Patent Application No. PCT/US2013/064237; 16 Pages.
Paranjape et al., "A CMOS-Compatible 2-D Vertical Hall Magnetic-Field Sensor Using Active Carrier Confinement and Post-Process Micromatchining;" IEEE Sensors and Actuators, vol. 53, No. 1; May 1996; 6 Pages.
Letter to Taiwan International Patent & Law Office dated Sep. 7, 2015; for Taiwanese Pat. App. No. 102137325; 2 pages.
Taiwan Amendment and Response (including English translation of Specification and Claims) filed on Sep. 16, 2014; for Taiwanese Pat. App. No. 102137325; 18 pages.
Office Action dated Dec. 18, 2014; for U.S. Appl. No. 14/041,063; 30 pages.
Office Action dated Sep. 17, 2015; for U.S. Appl. No. 14/04,063; 20 pages.
European Patent Office Rule 161 datd Aug. 7, 2015; for European Pat. App. No. 13780484.5-1560; 2 pages.
PCT International Preliminary Report on Patentability and Written Opinion of the ISA dated Sep. 24, 2015; for PCT Pat. App. No. PCT/US2014/011773; 6 pages.
Letter from Taiwan International Patent and Law Office dated Nov. 2, 2015; for Taiwanese Pat. App. No. 102137325; 2 pages.
Allowance Decision of Examination dated Oct. 29, 2015; for Taiwanese Pat. App. No. 102137325; 2 pages.
Response to Taiwan Office Action (with Amended English version of Specification) dated Aug. 5, 2015 corresponding to Taiwan Patent Application No. 103102458; Response filed on Nov. 5, 2015; 49 Pages.
Response to Office Action dated Sep. 17, 2015 for U.S. Appl. No. 14/041,063; Response filed Jan. 7, 2016; 6 Pages.
Notice of Allowance dated Feb. 2, 2016 for U.S. Appl. No. 14/041,063; 13 Pages.
U.S. Office Action dated Oct. 5, 2016 corresponding to U.S. Appl. No. 15/060,791; 25 Pages.
Response (w/Amended Claims and Allowed Specification) to European Office Action dated Aug. 7, 2015 corresponding to European Application No. 13780484.5; Response filed Feb. 17, 2016; 40 Pages.
Notice of Allowance dated May 25, 2016 corresponding to European Application No. 13780484.5; 6 Pages.
PCT International Preliminary Report dated Apr. 5, 2016 corresponding to International Application No. PCT/US2014/053826; 8 Pages.
European Communication Pursuant to Rules 161(1) and 162 EPC dated Apr. 13, 2016 corresponding to European Application No. 14766613.5; 2 Pages.
Taiwan Notice of Allowance dated Apr. 13, 2016 (with Foreign Associate Reporting Email dated Apr. 19, 2016) corresponding to Taiwan Application No. 103102458; 5 Pages.
European Office Action dated Oct. 15, 2015 corresponding to European Application No. 14702402.0; 2 Pages.
Response (with Amended Specification and Claims) to European Office Action dated Oct. 15, 2015 corresponding to European Application No. 14702402.0; Response filed Apr. 21, 2016; 31 Pages.
Preliminary Amendment filed on Oct. 23, 2013 corresponding to U.S. Appl. No. 13/752,681; 7 Pages.
U.S. Non-Final Office Action dated Jan. 30, 2014 corresponding to U.S. Appl. No. 13/752,681; 20 Pages.
Response to U.S. Non-Final Office Action dated Jan. 30, 2014 corresponding to U.S. Appl. No. 13/752,681; Response filed on Apr. 29, 2014; 23 Pages.
U.S. Final Office Action dated Jun. 19, 2014 corresponding to U.S. Appl. No. 13/752,681; 17 Pages.
Response to U.S. Final Office Action dated Jun. 19, 2014 corresponding to U.S. Appl. No. 13/752,681; Response filed on Sep. 19, 2014; 12 Pages.
Advisory Action dated Oct. 24, 2014 corresponding to U.S. Appl. No. 13/752,681; 3 Pages.
U.S. Final Office Action dated Dec. 4, 2014 corresponding to U.S. Appl. No. 13/752,681; 24 Pages.
Request for Continued Examination (RCE) and Response to U.S. Final Office Action dated Dec. 4, 2014 corresponding to U.S. Appl. No. 13/752,681; RCE and Response filed on Apr. 6, 2015; 17 Pages.
U.S. Non-Final Office Action dated Aug. 13, 2015 corresponding to U.S. Appl. No. 13/752,681; 27 Pages.
Response to U.S. Non-Final Office Action dated Aug. 13, 2015 corresponding to U.S. Appl. No. 13/752,681; Response filed on Sep. 15, 2015; 11 Pages.
Notice of Appeal filed on Mar. 30, 2016 corresponding to U.S. Appl. No. 13/752,681; 2 Pages.
Appeal Brief filed on May 24, 2016 corresponding to U.S. Appl. No. 13/752,681; 16 Pages.
U.S. Notice of Allowance dated Sep. 28, 2016 corresponding to U.S. Appl. No. 13/752,681; 13 Pages.
Second U.S. Notice of Allowance dated Nov. 4, 2016 corresponding to U.S. Appl. No. 13/752,681; 10 Pages.
Reymond et al., "True 2D CMOS Integrated Hall Sensor;" Proceedings of the IEEE Sensors 2007 Conference; Oct. 28-31, 2007; pp. 860-863; 4 Pages.
Response to U.S. Office Action dated Oct. 5, 2016 corresponding to U.S. Appl. No. 15/060,791; Response filed on Dec. 22, 2016; 10 Pages.
Response to U.S. Final Office Action dated May 16, 2017 for U.S. Appl. No. 15/060,791; Response filed on May 31, 2017; 7 Pages.
Notice of Allowance dated Jun. 20, 2017 for U.S. Appl. No. 15/060,791; 8 Pages.
Response to European communication dated Oct. 24, 2017 for European Application No. EP 14702402.0; Response filed on Mar. 7, 2018; 4 pages.
Amended Claims filed Mar. 7, 2018 for European Application No. EP 14702402.0; 7 pages.
Response (with Amended Claims and Specifications) to European Office Action dated Dec. 1, 2016 for European Application No. 14766613.5; Response filed on Feb. 13, 2017; 14 Pages.
U.S. Final Office Action dated May 16, 2017 corresponding to U.S. Appl. No. 15/060,791; 12 Pages.

* cited by examiner

VERTICAL HALL EFFECT ELEMENT WITH IMPROVED SENSITIVITY

CROSS REFERENCE TO RELATED APPLICATIONS

This application is a divisional of co-pending U.S. application Ser. No. 13/752,681 filed Jan. 29, 2013, which is incorporated by reference herein in its entity.

STATEMENT REGARDING FEDERALLY SPONSORED RESEARCH

Not Applicable.

FIELD OF THE INVENTION

This invention relates generally to magnetic field sensing elements and, more particularly, to a vertical Hall Effect element having an improved sensitivity to magnetic fields.

BACKGROUND OF THE INVENTION

Hall Effect elements that can sense a magnetic field are known. There is a variety of different types of Hall Effect elements, for example, a planar Hall element, a vertical Hall Effect element, and a circular vertical Hall (CVH) element.

As is known, some of the above-described Hall Effect elements tend to have an axis of maximum sensitivity parallel to a substrate that supports the magnetic field sensing element, and others of the above-described Hall Effect elements tend to have an axis of maximum sensitivity perpendicular to a substrate that supports the magnetic field sensing element. In particular, planar Hall elements tend to have axes of sensitivity perpendicular to a substrate, while vertical Hall Effect elements and CVH sensing elements tend to have axes of sensitivity parallel to a substrate.

Sensitivity is one parameter that can be used to characterize each one of the above types of Hall Effect elements. Sensitivity can be expressed, for example, in units of micro volts per Gauss per volt, i.e., µV/G/V, for which the micro volts per Gauss refers to an output voltage of the Hall Effect element per Gauss experienced by the Hall Effect element, and for which the volts refers to a DC voltage applied to drive the Hall Effect element.

In general, a high sensitivity is desirable, since the high sensitivity provides a good signal-to-noise ratio for an output signal generated by the Hall Effect element.

SUMMARY OF THE INVENTION

The present invention provides a vertical Hall Effect element with a high sensitivity.

In accordance with one aspect of the present invention, a Hall element disposed over a substrate includes an N-type epitaxial layer disposed over the substrate. The Hall element also includes a plurality of pickups implanted and diffused into the epitaxial layer. Adjacent pairs of the plurality of pickups are separated by separation regions. Each one of the plurality of pickups includes a respective N+ type diffusion. The Hall element also includes a low-voltage P-well region implanted and diffused into the epitaxial layer. The low-voltage P-well region extends into the separation regions. The Hall element is configured to generate a Hall voltage between at least one pair of the plurality of pickups. The Hall voltage is most responsive to a magnetic field directed parallel to a major surface of the substrate.

In accordance with another aspect of the present invention, a method of fabricating a Hall element over a substrate includes depositing an N-type epitaxial layer disposed over the substrate. The method also includes implanting and diffusing a plurality of pickups into the epitaxial layer. Adjacent pairs of the plurality of pickups are separated by separation regions. Each one of the plurality of pickups includes a respective N+ type diffusion. The method also includes implanting and diffusing a low-voltage P-well region into the epitaxial layer. The low-voltage P-well region extends into the separation regions. The Hall element is configured to generate a Hall voltage between at least one pair of the plurality of pickups. The Hall voltage is most responsive to a magnetic field directed parallel to a major surface of the substrate.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "substrate" is used to describe any type of structure with a flat surface upon which semiconductor materials can be deposited and/or into which semiconductor materials can be implanted and diffused. In some embodiments, the substrate is a P-type silicon substrate having a particular range of concentrations of P-type atoms (i.e., ions)

As used herein, the term "epi" is used to refer to an epitaxial layer, for example, an N-type epitaxial layer, disposed over a substrate, for example, a P-type substrate, and having a particular range of concentrations of N-type atoms (i.e. ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e. ions).

As used herein, the term "P-well" is used to refer to a region implanted and diffused into a semiconductor layer, for example, into a surface of the epitaxial layer further from the substrate, and having a particular range of concentrations of P-type atoms (i.e. ions).

As used herein, the term "low-voltage P-well" or simply "LP" is used to refer to a region implanted and diffused into a semiconductor layer, for example, into a surface of the epitaxial layer further from the substrate, and having a particular range of concentrations of P-type atoms (i.e. ions).

As used herein, the term "P-type barrier layer" or simply "PBL" is used to refer to a region implanted and diffused into a semiconductor layer, for example, implanted into the substrate and then upwardly diffused into the epitaxial (epi) layer. The epi layer can be grown after PBL implant and diffusion steps, and the upward diffusion into epi layer can be performed during a field oxidation process.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e. ions).

As used herein, the concentrations of the above types of semiconductor structures fall into the following ranges:
substrate=about $1 \times 10^{15}$ P-type atoms per cm$^3$, for example, boron atoms.
epi=about $5 \times 10^{14}$ to about $1 \times 10^{16}$ N-type atoms per cm$^3$, for example, Arsenic atoms,
  where: $5 \times 10^{14}$ can be representative of a concentration of epi bulk doping, and $1 \times 10^{16}$ can be representative of a concentration at a surface region of the epi layer at about 2 μm depth created by an additional epi implant step. (Alternatively, $1 \times 10^{15}$ to $6 \times 10^{15}$)
N+=about $1 \times 10^{20}$ N-type atoms per cm$^3$, for example, phosphorous atoms.
P-well=about $1 \times 10^{16}$ P-type atoms per cm$^3$, for example, boron atoms.
LP=about $5 \times 10^{17}$ atoms per cm$^3$, for example, boron atoms.
PBL=about $1 \times 10^{18}$ to about 10×18 P-type atoms per cm$^3$, for example, boron atoms.
P+=about $3 \times 10^{19}$ to about $5 \times 10^{19}$ P-type atoms per cm$^3$, for example, boron atoms.

In some embodiments, the concentrations are outside of the above ranges or values, but within about +/−twenty percent of the above ranges or values.

Before describing the present invention, it should be noted that reference is sometimes made herein to assemblies having a particular shape (e.g., rectangular). One of ordinary skill in the art will appreciate, however, that the techniques described herein are applicable to a variety of sizes and shapes.

Figure 1:
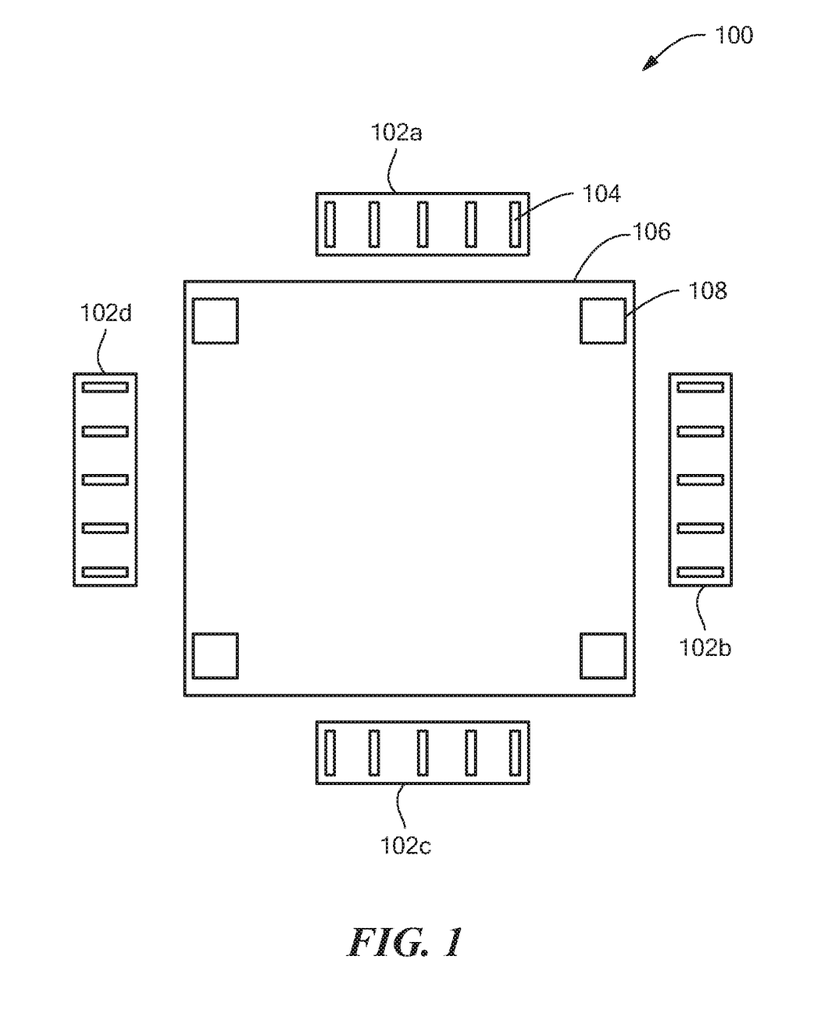
FIG. 1 is a block diagram showing a top view of a combination of a planar Hall Effect element with four vertical Hall Effect elements, resulting in a structure that can, in combination with electronics (not shown), can generate an output signal representative of a magnitude of magnetic field vector in three-dimensional space.

Referring to FIG. 1, an exemplary Hall Effect element combination 100 includes a planar Hall Effect element 106 and also four vertical Hall affects elements 102a, 102b, 102c, 102d. The planar Hall Effect element 106 can include, for example, four pickups of which a pickup 108 is but one example. Pickups are described more fully below in conjunction with FIGS. 2 and 3. Each one of the vertical Hall Effect elements 102a, 102b, 102c, 102d can include, for example, five pickups, of which a pickup 104 is but one example. It will, however, be understood that, in particular, the vertical Hall Effect elements 102a, 102b, 102c, 102d can have any number of pickups greater than five pickups. Structure of the vertical Hall Effect elements 102a, 102b, 102c, 102d is described more fully below in conjunction with FIGS. 2, 3, and 4.

It will be understood that the above-described pickups 108, 104 are semiconductor structures to which electrical connections can be made. It will also be understood that outer boundaries of the planar Hall Effect element 106 and boundaries of the vertical Hall Effect elements 102a, 102b, 102c, 102d are generally defined by edges of respective epitaxial (epi) regions bounded by respective isolation regions defined, for example, by respective P+, LP, P-well and PBL regions (not shown) surrounding the epi regions. Such regions are described below in conjunction with FIG. 3.

As described above, the planar Hall Effect element 106 can have an axis of maximum sensitivity that is perpendicular to the page, i.e., perpendicular to a substrate on which the planar Hall Effect element 106 is formed. In contrast, the vertical Hall Effect elements 102a, 102c can have respective axes of maximum sensitivity that are parallel to the page, i.e., parallel to the substrate on which the vertical Hall Effect elements 102a, 102c are formed, and, in particular in a direction up and down on the page (in a portrait orientation). Similarly, the vertical Hall Effect elements 102b, 102d can have respective axes of maximum sensitivity that are parallel to the page, i.e., parallel to the substrate on which the vertical Hall Effect elements 102b, 102d are formed, and, in particular in a direction side to side on the page (in a portrait orientation).

Thus, with a Hall Effect element combination 100, it will be understood that the signals can be generated that are representative of x, y, and z magnitude components of the magnetic field vector having three dimensions. While processing electronics are not shown, it will be understood that electronics can be used to receive and process signals from the Hall Effect element combination 100 and to generate an electronic signal representative of a magnitude of the magnetic field vector having the three dimensions. Furthermore, the pointing direction of the magnetic field vector can be determined by the electronics.

While four vertical Hall Effect elements 102a, 102b, 102c, 102d are shown, other embodiments can use as few as two vertical Hall Effect elements, or more than four vertical Hall Effect elements.

Figure 2:
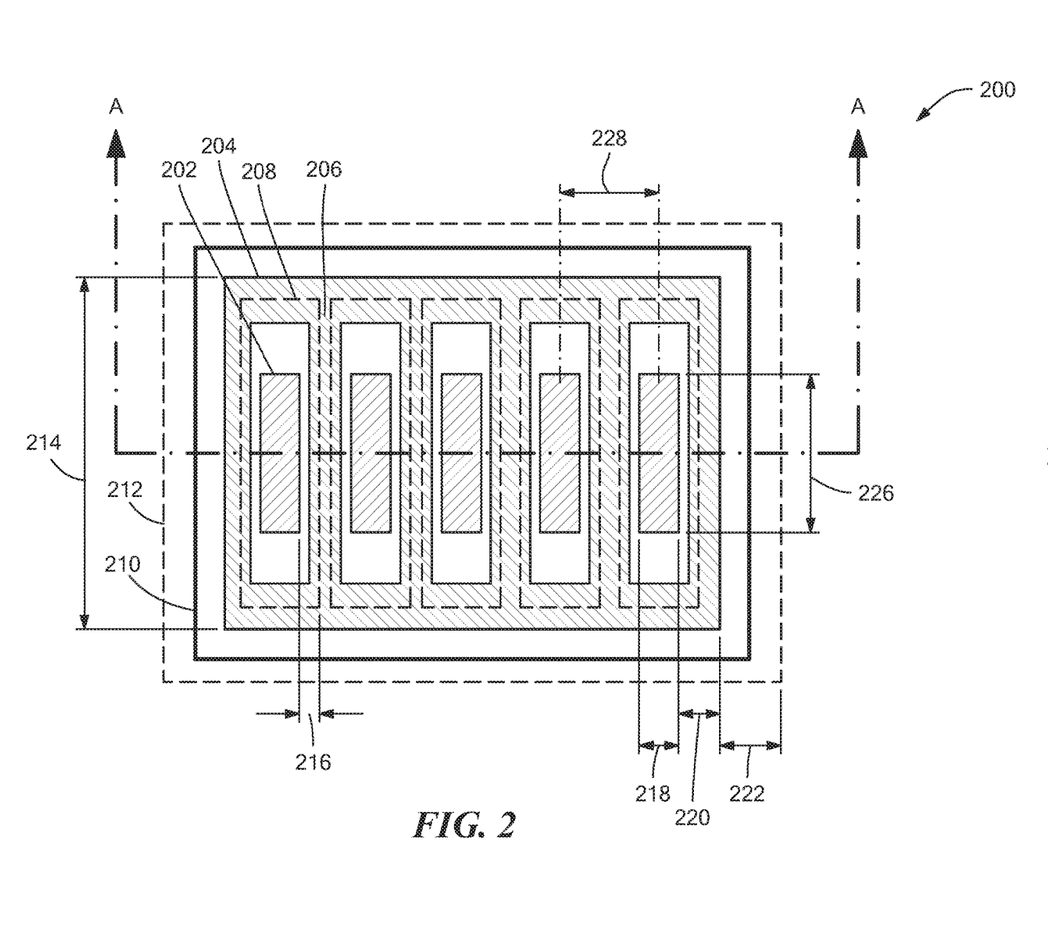
FIG. 2 is a block diagram showing a cross-sectional top view of a vertical Hall Effect element of FIG. 1 having a low-voltage P-well region.
Figure 3:
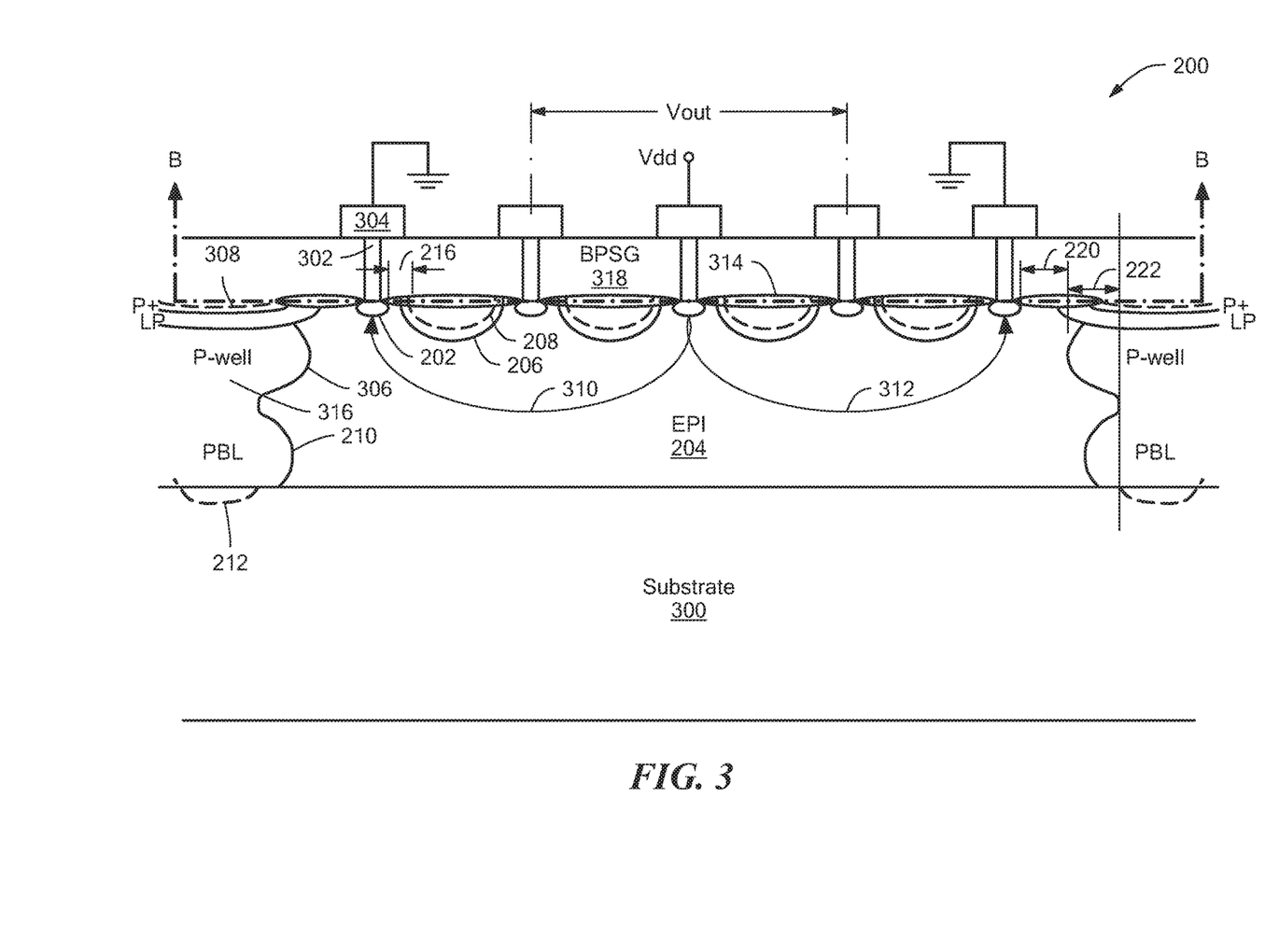
FIG. 3 is a block diagram showing a vertical cross section of the vertical Hall Effect element of FIG. 2.

Referring now to FIGS. 2 and 3 together, for which FIG. 2 shows a cross-sectional top view along a section line BB of FIG. 3 and FIG. 3 shows a cross-sectional side view along a section line A-A of FIG. 2, and in which like elements are shown having like reference designations, a vertical Hall Effect element 200 can be the same as or similar to any one of the vertical Hall Effect elements 102a, 102b, 102c, 102d of FIG. 1. The vertical Hall Effect element 200 can be used alone, or alternatively, in combination with any other number of planar or vertical Hall Effect elements.

The vertical Hall Effect element 200 is representative of the vertical Hall element at an intermediate step of integrated circuit fabrication. In particular, the vertical Hall element 200 does not show additional layers and structures that may be formed over the vertical Hall element 200.

In addition, the vertical Hall element 200 does not show some structures that are temporary, for example, photo resist masks, which can be removed during the fabrication process of the vertical Hall element 200. Accordingly, reference may be made below to patterning that uses photo resist masks to provide openings for implant steps. However, in other instances described below, a field oxide layer can be used to provide openings for some implant and diffusion steps.

The vertical Hall Effect element 200 can be constructed over a substrate 300, in particular, within and upon an epitaxial (epi) region 204 (also referred to herein as an epi layer) disposed upon the substrate 300.

An outer horizontal boundary of the epi region 204 is determined by an inner edge (closest to the pickups) of a P-well region 306 that surrounds the pickups. The P-well region 306 is implanted and diffused into the epi region 204 from a surface of the epi region 204 furthest from the substrate 300. A dashed line 308 is representative of an edge of the P-well region 306 after it is implanted into the epi region 204, but before it is diffused by heating steps in fabrication of the vertical Hall Effect element 200. P+ and LP regions may result over the P-well region 306.

In some embodiments, the P-well implant 308 is formed in conjunction with a photo resist mask that provides openings for the implantation, and which is later removed. In some embodiments, the P-well implant 306 is performed prior to growth of a field oxide layer 314 described more fully below.

The vertical Hall Effect element 200 can include five so-called "pickups," of which the pickup 202 is representative. As used herein, the term "pickup" is used to describe an NP active region implanted and diffused into a semiconductor structure, i.e., into an outer surface of the epi region 204, and which is used to provide an area at which an electrical signal is received from the semiconductor structure or at which an electrical signal is input to the semiconductor structure. In particular, the pickup 202 is an active or device region first defined by a "device" photo resist mask, which is thereafter removed.

Placement of the device photo resist mask (not shown) and implantation of the pickups can be preceded by formation of the field oxide layer 314 over an upper surface of the epi region 204. Openings can be provided (i.e., etched) through the field oxide layer 314 by way of the device photo resist mask, the openings for implantation of the pickups, e.g., 202. Openings through the field oxide layer 314 may be provided over the P-well region 306 for the masked P+ implant.

An LP region 206 is implanted and diffused into the outer surface of the epi region 204. A dashed line 208 is representative of the LP region 206 after it is implanted into the epi layer 204 but before it is further diffused. The further diffusion results in the LP region 206 becoming closer to the pickup 202. The LP region 206 can be defined by a photo resist mask, which is thereafter removed and is not shown.

In some embodiments, placement of the photo resist mask (not shown) and implantation of the LP region 206 is preceded by formation of the above-described field oxide layer 314 over the upper surface of the epi region 204, and the diffusion of the LP region 206 takes place through the field oxide layer 314 and into the epi region 204. Thus, in some embodiments, openings though the field oxide layer 314 are not provided for the LP region 206.

The LP region 206 can be comprised of one contiguous LP region 206 with different parts. In other embodiments, the LP region 206 can be comprised of separate non-contiguous parts.

The LP region 206 extends into so-called "separation regions" between the pickups, e.g., 202.

A borophosphosilicate glass (BPSG) layer, i.e., a doped oxide, 318 can be deposited over the top of the field oxide and its opening regions (pickups) 204. This BPSG layer in the vertical Hall element 200 provides a separation and isolation between the layers shown and additional layers not shown.

The BPSG layer 318 can be masked (e.g., with a contact mask) and etched to form openings through the BPSG layer 318, which are so-called "contacts" described below. As described above, openings through the field oxide layer are created and defined with a "device" mask or an "active" mask over the pickups, e.g., the pickup 202, and it is through those openings that the pickups 202 are originally formed with N+ implant and diffusion steps prior to the BPSG deposition. Similarly, the masked P+ implant and diffusion can be formed in the outer isolation region over the field oxide opening there.

Associated with each one of the pickups, for example, with the pickup 202, is a so-called "contact," of which a contact 302 is representative. As used herein, the term "contact" is used to describe a metallized connection of a semiconductor structure, for example, metal plating over contact openings through the BPSG layer 318. The contact, e.g., 302, provides a low resistance electrical coupling to a pickup, e.g., to the pickup 202.

A contact opening can have a width smaller than a width of the pickup 202. While one contact is shown for each pickup, in other embodiments, there can be a plurality of contacts in electrical communication with an associated pickup.

Associated with an electrically coupled to each one of the contacts, for example, with the contact 302 (or with a plurality of contacts coupled to the pickup 202), is a metal structure, or simply "metal," of which a metal 304 is representative. As used herein, the term "metal" is used to describe a portion of a metal layer of a semiconductor structure used to provide a low resistance electrical coupling to a contact, e.g., to the contact 302.

The top view of FIG. 2 is a horizontal cross section taken along section line B-B of FIG. 3, and thus, does not include the metal 304.

A PBL structure 210 is diffused within the epi region 204 and over the substrate 300 before placement of the epi region 204. A dashed line 212 is representative of the PBL structure 210 after it is implanted into the substrate 300, but before it is diffused by heating steps in fabrication of the vertical Hall Effect element 200.

The PBL structure 210 joins with or merges with the P-well region 306 in a region 316 forming a barrier to electrical charges that move within the epi layer 204 during operation of the vertical Hall Effect element 200.

As described above, adjacent pairs of the plurality of pickups are separated by so-called separation regions, e.g., a region in which the LP region 206 is disposed. Each one of the plurality of pickups, e.g., pickup 202, is comprised of an N+ implant and diffusion.

Other layers 318 can also be disposed over the epi region 204. In some embodiments the other layers 318 include one or more interlayer dielectric (ILD) layers, one or more metal layers, e.g., M2 or and M3 layers, and a passivation layer, none of which are shown.

It will be appreciated that the metals 304 are on a so-called metal one M1 layer, in which case the BPSG layer 318 can be used. However, between different metal layers, the oxide between layers is called an interlayer dielectric (ILD) layer.

The vertical Hall Effect element 200 can be coupled to receive a power supply voltage Vdd, for example, at a center metal structure, and can be coupled to a reference voltage, for example, a ground reference voltage, at another two metal structures. Currents 310, 312 result.

In operation, an output voltage Vout is proportional to a magnetic field experienced by the vertical Hall Effect element in a direction into the page of FIG. 3.

It will be understood that a sensitivity of the vertical Hall Effect element 200 is related to vertical portions of the currents 310, 312, i.e., portions of the current paths that are perpendicular to the substrate 300 of FIG. 3. Thus, in order to provide more sensitivity, the vertical portions of the currents 310, 312 should be increased in physical length. The LP regions, e.g., 206, provide a blockage of portions of the currents 310, 312 that might otherwise flow horizontally directly between the center pickup and the end pickups. Thus, the LP regions, e.g., 206, cause the currents 310, 312 to have more extended vertical regions than would otherwise be available. A higher sensitivity vertical Hall Effect element 200 results.

In some embodiments, a distance 228 (Sp_pkpk) between centers of adjacent pickups is within about +/−ten percent of 3.5 micrometers.

In some embodiments, a distance 220 (Es_pkep) between an edge of an outer one of the plurality of pickups, e.g., 206, and a closest edge of the P-well region 306 (that defines the edge of the epi region 204) is within about +/−ten percent of 5.5 micrometers.

In some embodiments, a distance 216 (Sp_pklp) between an edge of each one of the pickups, e.g., 202, and a closest edge of a closest LP region, e.g., 206, before it is diffused, see, e.g., 208, into the epi region 204 is within about +/−ten percent of 0.4 micrometers. It will be understood that the LP regions, e.g., 206, after diffusion should not touch the pickups, e.g., the pickup 202.

In some embodiments, a height 226 (PKH) of each pickup, e.g., 202, is within about +/−ten percent of 9.0 micrometers.

In some embodiments, a width 218 (PKW) of each pickup, e.g., 202, is within about +/−ten percent of 1.0 micrometers.

In some embodiments, a smallest distance 222 (SP_eppb) between an outer edge of the epi region 204 and a closest edge of the PBL structure 210 in a direction parallel to the major surface of the substrate before PBL structure is diffused, see, e.g., 212, is within about +/−ten percent of 5.0 micrometers. By spacing the PBL structure in this way away from the currents 310, 312, outer vertical portions of the currents 310, 312 can remain more vertical, resulting in a more sensitive vertical Hall Effect element.

In some embodiments, a width 214 (EP_width) of the epi region 204, i.e., a distance between opposite edges of the P-well region 306 is within about +/−ten percent of 20.0 micrometers.

The above combination of doping concentration and dimensions can result in a vertical Hall Effect element having a sensitivity of about five to six microvolts per Gauss per volt.

While the vertical Hall Effect element 200 is shown to include five pickups, in other similar embodiments, a vertical Hall Effect element can include any number of pickups more than five pickups. It will be understood how to drive the other embodiments of vertical Hall Effect elements and it will be understood how to receive output signals from the other embodiments of vertical Hall Effect elements.

In some embodiments, in operation, the vertical Hall Effect element 200 is "chopped." It will be understood that chopping is an arrangement by which at some times a selected pickup of the vertical Hall Effect element 200 is driven and at other times a different selected pickup is driven. Similarly, at some times an output signal is generated between a certain pair of the pickups, and at other times an output signal is generated between the different pair of the pickups. It will further be understood that the chopping arrangement is often used with both planar and vertical Hall Effect elements to result in a reduction of the DC offset voltage.

In some embodiments, a particular non-limiting sequence of fabrication steps can be used to fabricate the vertical Hall Effect element 200. However, additional layers and additional steps can also be used.

1. Implant PBL 212 upon substrate 300.
2. Grow epi region 204 of about 6.0 μm in thickness (range 5.5 μm-6.5 μm) with bulk doping level of about $1 \times 10^{15}$.
3. Shallow implant epi region 204 to make concentration about $5 \times 10^{15}$ to $6 \times 10^{15}$ within 2 μm depth.
4. Mask and implant P-well region 308.
5. Device mask and grow field oxide, which diffuses PBL upward into epi layer and P-well downward into epi layer until merged 210, 306, 316.
6. Mask for LP implant 208 and diffuse LP to provide the LP region 206 and also in outer isolation region.
7. Masked implant N+ pickups 202, and masked P+ implant over the outer isolation region.
8. Deposit BPSG 318 over field oxide layer.
9. Open contacts 302 (i.e., etch though BPSG layer 318), and deposit metal layer 304 and patterning (masked M1 etch).
10. Deposit interlayer dielectric (ILD), via openings, and other top metal layers (not shown).
11. Deposit passivation layer and patterning (not shown)

Figure 4:
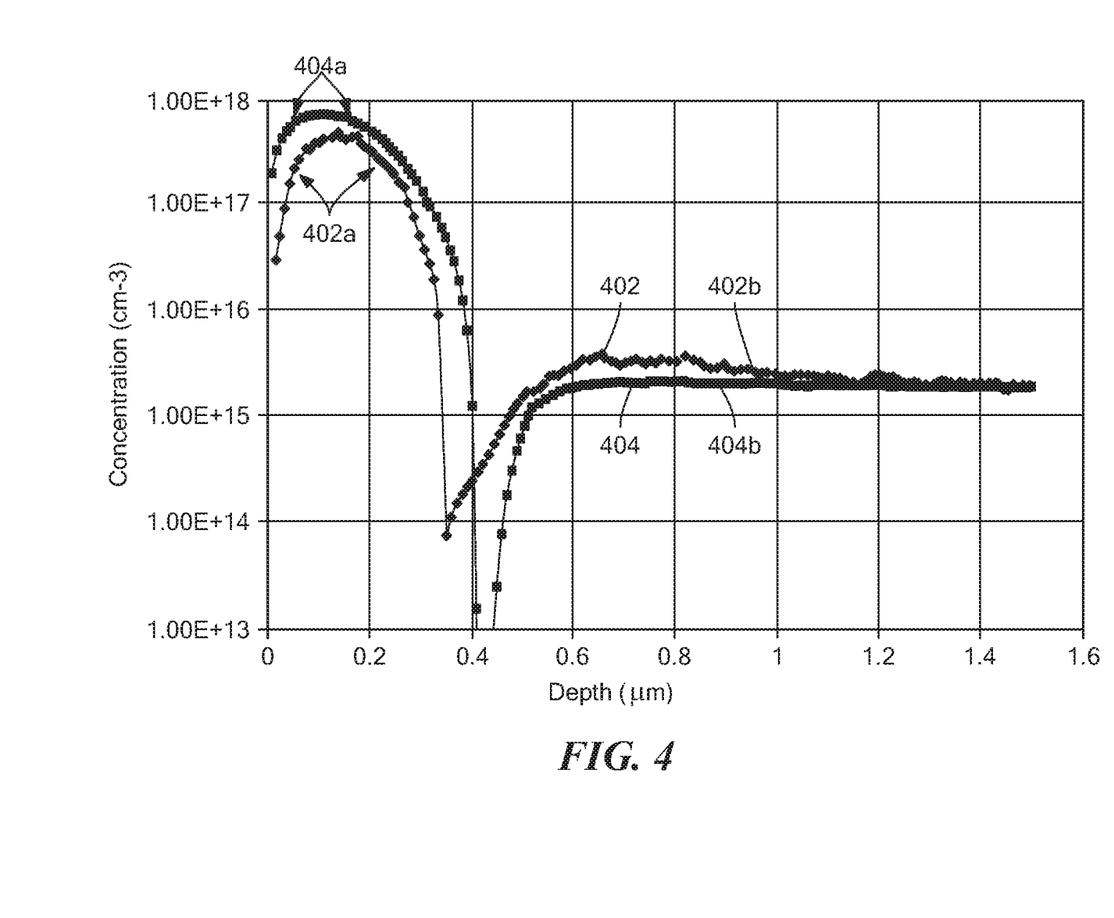
FIG. 4 is a graph showing a concentration versus depths of the low-voltage P-well region of the Hall Effect element of FIGS. 2 and 3.

Referring now to FIG. 4, a graph 400 has a vertical axis with a scale in units of doping concentration in units of atoms (i.e., ions, per cubic centimeter), and a horizontal axis with a scale in units of depth into the epi region 204 of FIGS. 2 and 3. Portions 402a, 404a of curves 402, 404 (TCAD simulation vs. real measured doping profile, respectively) are each representative of doping profiles for the LP region 206 of FIGS. 2 and 3, after diffusion into the epi region 204.

As indicated above, the peak doping concentration of the LP region 204 is about $5 \times 10^{17}$ in log scale at about 0.1 μm below the surface of the epi region 204 of FIGS. 2 and 3. Tail ends 402b, 404b of the curves 402, 404 are representative of the doping concentrations of the underlying epi region 204, i.e., about $1.5 \times 10^{15}$.

As described above in conjunction with FIG. 3, it is vertical portions of the currents 310, 312 that contribute most to sensitivity of the vertical Hall Effect element 200. It is further discussed above that the LP region, e.g., 206, forces the currents 310, 312 more downward, and more vertically, within the EPI region 204. Accordingly, diffusion depth of the LP region 206 is important. If the LP region 206 is too shallow, it has little effect upon directing the currents 310, 312 downward and more vertically. If the LP region 206 is too deep, due to sideways diffusion of the LP region 206 when diffused more deeply, the pickups must be more widely spaced, and the currents 310, 312 have longer paths and may be reduced in magnitude, resulting in low Hall sensitivity.

Diffusion depth of the LP region 206 is deep enough to force the currents 310, 312 more vertically and downward. Other diffusion types, for example, a P+ type diffusion (which is similar in depth to an N+ type diffusion, both are commonly used for source/drain doping in the CMOS process), if used in place of the LP region 206, would tend to be too shallow, and therefore, would tend not to drive the currents 310, 312 sufficiently downward, and little improvement in sensitivity may result. Conversely, a P-well, if used in place of the LP region 206, would tend to be too deep, and therefore, the pickups must be more widely spaced, and the current paths 310, 312 would be longer and face higher resistance, and again, little improvement or lowering in sensitivity may result.

Figure 5:
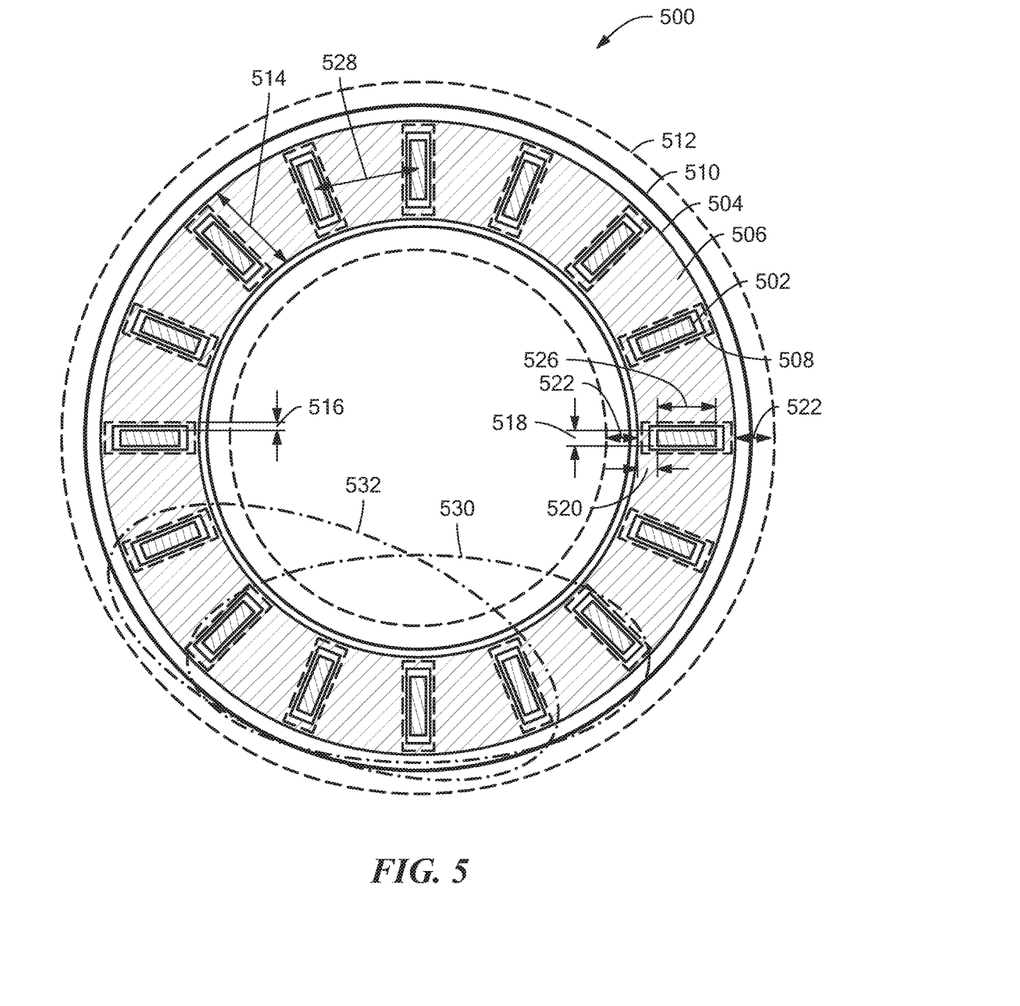
FIG. 5 is a block diagram showing a cross-sectional top view of a circular vertical Hall (CVH) sensing element having a low-voltage P-well region.

Referring now to FIG. 5, a circular vertical Hall (CVH) sensing element 500 is essentially comprised of a plurality of vertical Hall Effect elements, all disposed over a common epitaxial region 504. The CVH sensing element 500 includes a plurality of pickups, of which a pickup 502 is representative.

While a vertical cross section of the vertical Hall Effect element is not shown, the cross section of the vertical Hall Effect element 500 is substantially the same as the cross section of FIG. 3, and thus, is not shown here.

The CVH sensing element 500 is shown to include sixteen pickups. However, in other embodiments a CVH sensing element can have more than 16 pickups.

An individual vertical Hall Effect element 530 of the CVH sensing element 500 can include, for example, a first five adjacent pickups. A next vertical Hall Effect element 532 of the CVH sensing element 500 can include a second five adjacent pickups. In some embodiments, the first five adjacent pickups overlaps with the second five adjacent pickups, for example, with an overlap of one pickup, resulting in a total of sixteen overlapping vertical Hall Effect elements within the CVH sensing element 500. However, in other embodiments, the vertical Hall Effect elements need not overlap, or they can overlap by more than one vertical Hall Effect element contact, both resulting in a different number of vertical Hall Effect elements within the CVH sensing element 500.

In some embodiments each vertical Hall Effect element is driven in a chopped arrangement as described above in conjunction with FIGS. 2 and 3, in order to remove a DC offset voltage from each one of the vertical Hall Effect elements.

The CVH sensing element 500 is constructed over a substrate (not identified), in particular, within and upon the common epi region 504. An outer boundary of the epi region 504 is determined by an inner edge (closest to the pickups) of a P-well region that surrounds the pickups. The P-well region is implanted and diffused into the epi region 504.

A PBL structure 510 is disposed under the epitaxial layer 504 and over the substrate and also surrounds the plurality of pickups, e.g., 502. A dashed line 512 is representative of an edge the PBL structure 510 after it is implanted into the substrate but before it is diffused into the epi region 504 by heating steps in fabrication of the CVH sensing element 500.

The PBL structure 510 diffused upward and into the epi region 504 joins with or merges with the P-well region diffused downward into the epi region 504, forming a barrier to electrical charges that move within the epi region 504.

Adjacent pairs of the plurality of pickups are separated by so-called separation regions. Each one of the plurality of pickups, e.g., pickup 502, is comprised of an N+ diffusion.

In the separation regions is diffused portions of a low voltage P-well (LP) region, of which an LP region 506 is representative. A dashed line 508 is representative of an edge of the LP region 506 before it is diffused into the epi layer further by high temperatures used during manufacture of the CVH sensing element.

As described above in conjunction with FIG. 3, other layers (not shown) can be disposed over the epi region 504. In some embodiments the other layers 318 include other metal layers, other field oxide dielectric layer, and a passivation layer.

As described above, a vertical cross section of each vertical Hall Effect element of the CVH sensing element 500 can be the same as or similar to the cross section of the vertical Hall Effect element 200 shown in with FIG. 3. Operation of each one of the vertical Hall Effect elements of the CVH sensing element 500 is the same as or similar to operation described above in conjunction with FIGS. 2 and 3.

In some embodiments, a distance 528 between centers of adjacent pickups is within about +/−ten percent of 3.5 micrometers.

In some embodiments, a distance 520 between an edge of an outer one of the plurality of pickups and a closest edge of the P-well region (that defines the edge of the epi region 504) is within about +/−ten percent of 5.5 micrometers.

In some embodiments, a distance 516 between an edge of each one of the pickups and a closest edge of the LP region 506 before it is diffused into the epi region is within about +/−ten percent of 0.4 micrometers. It will be understood that the LP regions, e.g., 506, after diffusion should not touch the pickups, e.g., the pickup 502.

In some embodiments, a height 526 of each pickup is within about +/−ten percent of 9.0 micrometers.

In some embodiments, a width 518 of each pickup is within about +/−ten percent of 1.0 micrometers.

In some embodiments, a smallest distance 522 between an outer edge of the epi layer 504 and a closest edge of the P-type barrier structure 510 in a direction parallel to the major surface of the substrate before it is diffused, see, e.g. 512, is within about +/−ten percent of 5.0 micrometers.

In some embodiments, a width 514 of the epi region 504, i.e., a distance between opposite edges of the P-well region is within about +/−ten percent of 20.0 micrometers.

The above combination of doping concentration and dimensions can result in each vertical Hall Effect element within the CVH sensing element 500 having a sensitivity of about five to six microvolts per Gauss per volt.

Operation of a CVH sensing element similar to the CVH sensing element 500 is described more fully, for example, in U.S. patent application Ser. No. 13/226,694, entitled "Magnetic Field Sensing Effect Combining A Circular Vertical Hall Magnetic Field Sensing Element With A Planar Hall Element," filed Sep. 7, 2011, which is assigned to the assignee of the present invention and which is incorporated herein in its entirely. Still further operation of a CVH sensing element is described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A method of fabricating a Hall element over a substrate, the method comprising:
    depositing an N-type epitaxial layer disposed over the substrate, the N-type epitaxial layer having a top surface and a bottom surface, the bottom surface proximate to the substrate;
    implanting and diffusing a plurality of pickups into the N-type epitaxial layer, each adjacent pair of the plurality of pickups separated by a respective separation region, each one of the plurality of pickups comprising a respective N+ type diffusion; and implanting and diffusing a low-voltage P-well region into the N-type epitaxial layer, wherein the low-voltage P-well region extends into each one of the separation regions, wherein the low voltage P-well extends to a depth of about 0.4 micrometers under the top surface of the N-type epitaxial layer, wherein a peak doping concentration of the low-voltage P-well region is about $5 \times 10^{17}$ atoms per cubic centimeter at a depth of about 0.1 micrometers under the top surface of the N-type epitaxial layer, wherein a spacing (Sp_pkpk) between centers of adjacent pairs of the plurality of pickups is within about +/−ten percent of 3.5 micrometers, wherein the low-voltage P-well region after diffusion does not reach the plurality of pickups, wherein the Hall element is configured to generate a Hall voltage between at least one pair of the plurality of pickups, and wherein the Hall voltage is most responsive to a magnetic field directed parallel to a major surface of the substrate;

implanting a P-type barrier structure into the substrate under the bottom surface of the N-type epitaxial layer, and surrounding the plurality of pickups;

diffusing the P-type barrier structure from the substrate and into the N-type epitaxial layer;

implanting a P-well region into the top surface of the N-type epitaxial layer; and diffusing the P-Well region into the N-type epitaxial layer surrounding the plurality of pickups, wherein the P-type barrier structure and the P-well region become coupled in a direction vertical to the substrate so as to form a barrier to electrical charges within the N-type epitaxial layer.

2. The method of claim 1, wherein the plurality of pickups is arranged in a straight line, forming a vertical Hall Effect element, or in a circle, forming a circular vertical Hall (CVH) sensing element.

3. The method of claim 1, wherein the Hall element is configured to pass a drive current between at least two of the plurality of pickups, and wherein a depth of the low-voltage P-well region extending into the separation regions is selected to force the drive current deeper and more vertically into the N-type epitaxial layer in relation to the major surface of the substrate, resulting in a more sensitive Hall element.

4. The method of claim 1, wherein a distance (Es_pkep) between an edge of one of the plurality of pickups and a closest edge of the P-well region is within about +/−ten percent of 5.5 micrometers.

5. The method of claim 4, wherein a smallest distance (Sp_pklp) from an edge of one of the plurality of pickups and a closest edge of the low-voltage P-well region before it is diffused is within about +/−ten percent of 0.4 micrometers.

6. The method of claim 5, wherein heights (PKH) of the plurality of pickups in a direction parallel to the major surface of the substrate are within about +/−ten percent of 9.0 micrometers.

7. The method of claim 6, wherein widths (PKW) of the plurality of pickups in a direction parallel to the major surface of the substrate are within about +/−ten percent of 1.0 micrometers.

8. The method of claim 7, wherein a smallest distance (SP_eppb) from an outer edge of the N-type epitaxial layer and a closest edge of the P-type barrier structure in a direction parallel to the major surface of the substrate before it is diffused is within about +/−ten percent of 5.0 micrometers.

9. The method of claim 8, wherein a width (EP_width) of the N-type epitaxial layer defined by a distance between opposite edges of the P-well region, is within about +/−ten percent of 20.0 micrometers.

10. The method of claim 9, wherein the plurality of pickups is arranged in a straight line, forming a vertical Hall Effect element.

11. The method of claim 9, wherein the plurality of pickups is arranged in a circle, forming a circular vertical Hall (CVH) sensing element.

12. The method of claim 1 wherein a diffusion depth and a doping concentration at the diffusion depth of the low voltage P-well region is less than a diffusion depth and a doping concentration at the diffusion depth of a P-well region in the same semiconductor process.

13. The method of claim 1 wherein the plurality of pickups comprises at least five pickups.

* * * * *

UNITED STATES PATENT AND TRADEMARK OFFICE
CERTIFICATE OF CORRECTION

PATENT NO. : 10,205,093 B2  Page 1 of 1
APPLICATION NO. : 15/370107
DATED : February 12, 2019
INVENTOR(S) : Yigong Wang It is certified that error appears in the above-identified patent and that said Letters Patent is hereby corrected as shown below:

In the Specification

Column 1, Line 10, delete "entity." and replace with --entirety--.

Column 2, Line 50, delete "ions)" and replace with --ions).--.

Column 3, Line 32, delete "10×18" and replace with --$2 \times 10^{18}$--.

Column 3, Line 47, delete "affects" and replace with --Effect--.

Column 6, Line 43, delete "M2 or and M3" and replace with --M2 and/or M3--.

Column 9, Line 39, delete "edge the" and replace with --edge of the--.

Column 10, Line 37, delete "entirely" and replace with --entirety--.

In the Claims

Column 10, Line 67, delete "diffusion; and" and replace with --diffusion;--.

Column 11, Line 8, delete "5×1017" and replace with --$5 \times 10^{17}$--.

Signed and Sealed this
Fourteenth Day of April, 2020

Andrei Iancu
*Director of the United States Patent and Trademark Office*